United States Patent
Ok et al.

(10) Patent No.: US 12,010,930 B2
(45) Date of Patent: Jun. 11, 2024

(54) WRAP-AROUND PROJECTION LINER FOR AI DEVICE

(71) Applicant: INTERNATIONAL BUSINESS MACHINES CORPORATION, Armonk, NY (US)

(72) Inventors: Injo Ok, Loudonville, NY (US); Hsueh-Chung Chen, Cohoes, NY (US); Mary Claire Silvestre, Clifton Park, NY (US); Yann Mignot, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 260 days.

(21) Appl. No.: 17/470,003

(22) Filed: Sep. 9, 2021

(65) Prior Publication Data
US 2023/0070462 A1    Mar. 9, 2023

(51) Int. Cl.
*H10N 70/00*    (2023.01)
*H10N 70/20*    (2023.01)

(52) U.S. Cl.
CPC ......... *H10N 70/828* (2023.02); *H10N 70/026* (2023.02); *H10N 70/231* (2023.02); *H10N 70/823* (2023.02); *H10N 70/8828* (2023.02)

(58) Field of Classification Search
CPC .. H10N 70/828; H10N 70/026; H10N 70/231; H10N 70/823; H10N 70/8828; H10N 70/063
See application file for complete search history.

(56) References Cited

U.S. PATENT DOCUMENTS

| | | | |
|---|---|---|---|
| 7,491,965 B2 | 2/2009 | Doyle et al. | |
| 7,932,507 B2 | 4/2011 | Chen et al. | |
| 8,471,236 B2 | 6/2013 | Breitwisch et al. | |
| 8,575,588 B2 | 11/2013 | Mathew et al. | |
| 9,293,199 B2 | 3/2016 | Krebs et al. | |
| 9,984,954 B2 * | 5/2018 | Dahlstrom | ........ H01L 21/76898 |
| 10,050,194 B1 | 8/2018 | Nardi et al. | |

(Continued)

FOREIGN PATENT DOCUMENTS

KR        101935348 B1    11/2018

OTHER PUBLICATIONS

Cho et al., "Design Optimization of a Type-I Heterojunction Tunneling Field-Effect Transistor (I-HTFET) for High Performance Logic Technology", Journal of Semiconductor Technology and Science, vol. 11, No. 3, Sep. 2011, pp. 1-8.

(Continued)

*Primary Examiner* — Jerome Leboeuf
(74) *Attorney, Agent, or Firm* — Tutunjian & Bitetto, P.C.; Samuel Waldbaum (57) ABSTRACT

A semiconductor structure includes a plurality of conductive lines formed within a dielectric, wherein each of the plurality of conductive lines electrically communicates with a respective contact, a metal layer disposed over each of the plurality of conductive lines, a phase change memory (PCM) element disposed over the metal layer of each of the plurality of conductive lines, and a projection liner encapsulating the PCM element. Spacers directly contact sidewalls of the projection liner and the PCM element includes a GeSbTe (germanium-antimony-tellurium or GST) layer.

20 Claims, 8 Drawing Sheets

(56) References Cited

U.S. PATENT DOCUMENTS

| | | | |
|---|---|---|---|
| 10,692,574 | B2 | 6/2020 | Kim et al. |
| 10,763,307 | B1 | 9/2020 | Carta et al. |
| 10,903,418 | B2 | 1/2021 | Bao et al. |
| 11,038,106 | B1 | 6/2021 | Radens et al. |
| 2008/0186760 | A1* | 8/2008 | Elmegreen ........... H10N 70/063 257/E47.001 |
| 2012/0153248 | A1* | 6/2012 | Krusin-Elbaum ... H10N 70/884 257/E45.001 |
| 2020/0058851 | A1* | 2/2020 | El-Hinnawy ...... H10N 70/8613 |
| 2020/0395537 | A1 | 12/2020 | Ok et al. |

OTHER PUBLICATIONS

Xie et al., "Self-healing of a confined phase change memory device with a metallic surfactant layer", Advanced Materials. Mar. 2018;30(9):1705587.

Koelmans, W. W., Sebastian, A., Jonnalagadda, V. P., Krebs, D., Dellmann, L., & Eleftheriou, E. (Sep. 3, 2015). Projected phase-change memory devices. Nature communications, 6(1), 1-7.

International Search Report from PCT/EP2022/074545 dated Dec. 23, 2022. (12 pages).

* cited by examiner

WRAP-AROUND PROJECTION LINER FOR AI DEVICE

BACKGROUND

The present invention relates generally to semiconductor devices, and more specifically, to forming a wrap-around projection liner for an artificial intelligence (AI) device.

Utilizing phase change memory for analog computing requires memory cells with resistance that changes linearly with programming pulses and is predictable and repeatable. Amorphous phase change materials often suffer from "resistance drift," whereby the resistance of the cell changes over time, which makes the resistance of the cell unpredictable.

SUMMARY

In accordance with an embodiment, a semiconductor structure is provided. The semiconductor structure includes a phase change memory (PCM) element horizontally and electrically connecting a first contact and a second contact and a projection liner encapsulating the PCM element.

In accordance with another embodiment, a semiconductor structure is provided. The semiconductor structure includes a plurality of conductive lines formed within a dielectric, wherein each of the plurality of conductive lines electrically communicates with a respective contact, a metal layer disposed over each of the plurality of conductive lines, a phase change memory (PCM) element disposed over the metal layer of each of the plurality of conductive lines, and a projection liner encapsulating the PCM element.

In accordance with yet another embodiment, a method is provided. The method includes forming a phase change memory (PCM) element, horizontally and electrically connecting the PCM element to a first contact and a second contact, and encapsulating the PCM element with a projection liner.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for constructing a wrap-around or all-around projection liner for a phase change material (PCM) device. PCM devices with resistive liners (e.g., projection segments) provide better cycling endurance and reduce resistance drift of the device due to bypass of current through the amorphous phase-change volume during a read operation. Self-healing of confined PCM devices by controlling the electromigration of the PCM at the nanoscale enables effective Joule heating to control the PCM and provides excellent reliability achieving more than $2\times10^{12}$ programing cycles and low drift and noise mitigation for multi-level cell operation, and no etching damage (constructing a confined cell). However, confined cells exhibit several issues such as chemical mechanical planarization (CMP) damage and GeSbTe (germanium-antimony-tellurium or GST) filling in the small confined cells.

Embodiments in accordance with the present invention provide methods and devices for alleviating such issues by forming a projection liner that minimizes reactive ion etch (RIE) damage during PCM formation. The exemplary embodiments employ of a horizontal confined cell structure of GST with a projection liner. The exemplary embodiments introduce a self-aligned bridge cell contact. Stated differently, a structure of a horizontal mushroom cell structure is introduced to improve endurance and resistance drift and programing current. As a result, the exemplary methods minimize WET damage of GST cells. The exemplary projection liner is a wrap-around liner or all-around liner that encompasses or encapsulates or surrounds the PCM material including the GST layer.

Phase change materials are capable of being switched between a first structural state in which the material is in a generally amorphous solid phase, and a second structural state in which the material is in a generally crystalline solid phase in the active region of the cell. The term "amorphous"

is used to refer to a relatively less ordered structure, more disordered than a single crystal, which has the detectable characteristics such as higher electrical resistivity than the crystalline phase. The term "crystalline" is used to refer to a relatively more ordered structure, more ordered than in an amorphous structure, which has detectable characteristics such as lower electrical resistivity than the amorphous phase. Other material characteristics affected by the change between amorphous and crystalline phases include atomic order, free electron density and activation energy. The material can be switched into either different solid phases or mixtures of two or more solid phases, providing a gray scale between completely amorphous and completely crystalline states.

The change from the amorphous to the crystalline state is generally a lower current operation, requiring a current that is sufficient to raise the phase change material to a level between a phase transition temperature and a melting temperature. The change from crystalline to amorphous, referred to as "reset," is generally a higher current operation, which includes a short high current density pulse to melt or break down the crystalline structure, after which the phase change material cools quickly, quenching the phase change process, thus allowing at least a portion of the phase change structure to stabilize in the amorphous state.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
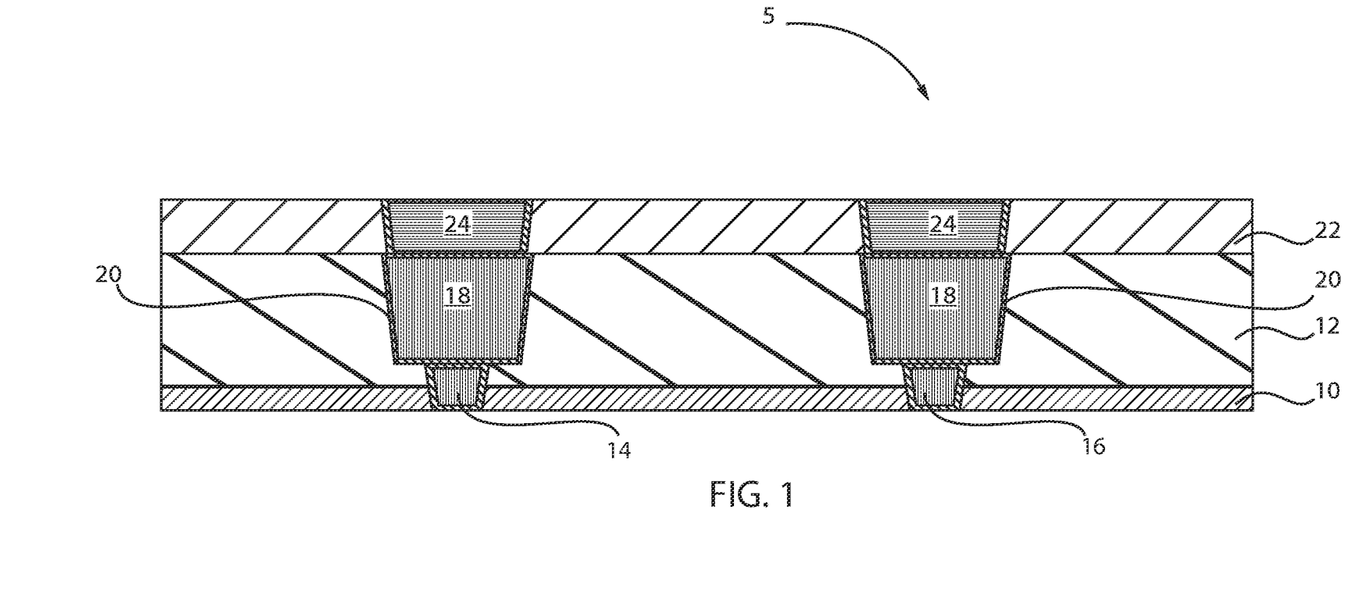
FIG. 1 is a cross-sectional view of a semiconductor structure including a plurality of conductive lines formed within a dielectric layer and where metal deposition takes place over one or more of the plurality of conductive lines, in accordance with an embodiment of the present invention.

FIG. 1 is a cross-sectional view of a semiconductor structure including a plurality of conductive lines formed within a dielectric layer and where metal deposition takes place over one or more of the plurality of conductive lines, in accordance with an embodiment of the present invention.

A semiconductor structure 5 includes a plurality of conductive lines 18 formed within trenches of an inter-layer dielectric (ILD) 12. The ILD 12 can be formed over a substrate 10. A conductive fill material or liner 20 can be formed or deposited around each of the trenches. In one example, the liner can be a tantalum nitride (TaN) liner 20 or in the alternative a tantalum (Ta) liner 20. In one example embodiment, the conductive fill material 20 can be deposited, for example, by electroplating, electroless plating, chemical vapor deposition (CVD), atomic layer deposition (ALD) and/or physical vapor deposition (PVD).

In various example embodiments, a dielectric 22 is deposited over the plurality of conductive lines 18. The dielectric 22 can have a thickness of, e.g., 50 nm.

Subsequently, metal deposition can take place. Metal deposition involves forming metal layers 24 directly over and in direct contact with the conductive lines 18. A width of the metal layers 24 can be approximately equal to a width of the conductive lines 18. The metal layers 24 can be, e.g., Ti, Ta, TiN or TaN or a combination thereof.

Moreover, a first contact 14 and a second contact 16 can be formed directly underneath the conductive lines 18. The first and second contacts 14, 16 extend through the substrate 10.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include a layered semiconductor such as, for example, Si/SiGe, a silicon-on-insulator or a SiGe-on-insulator.

The ILD 12 can include any materials known in the art, such as, for example, porous silicates, carbon doped oxides, silicon dioxides, silicon nitrides, silicon oxynitrides, or other dielectric materials. The ILD 12 can be formed using any method known in the art, such as, for example, chemical vapor deposition, plasma enhanced chemical vapor deposition, atomic layer deposition, or physical vapor deposition. The ILD 12 can have a thickness ranging from about 25 nm to about 200 nm.

The dielectric material of layer 12 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

The conductive lines 18 can be formed in the openings or trenches formed in the ILD 12. The conductive lines 18 can be any conductive materials known in the art, such as, for example, copper (Cu), aluminum (Al), or tungsten (W). The conductive lines 18 can be fabricated using any technique known in the art, such as, for example, a single or dual damascene technique. In an embodiment, not illustrated, the conductive lines 18 can be copper (Cu) and can include a metal liner, where a metal liner can be metals, such as, for example, tantalum nitride and tantalum (TaN/Ta), titanium, titanium nitride, cobalt, ruthenium, and manganese or a combination of these.

The dielectric layer 22 can be a nitride, for example, a silicon nitride (SiN), an oxynitride, for example, silicon oxynitride (SiON), or a combination thereof. In a preferred embodiment, the dielectric layer 22 can be silicon nitride (SiN), for example, $Si_3N_4$.

The conductive material of the metal layer 24 can be copper (Cu), cobalt (Co), aluminum (Al), platinum (Pt), gold (Au), tungsten (W), titanium (Ti), or any combination thereof. The metal layer 24 can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

Figure 2:
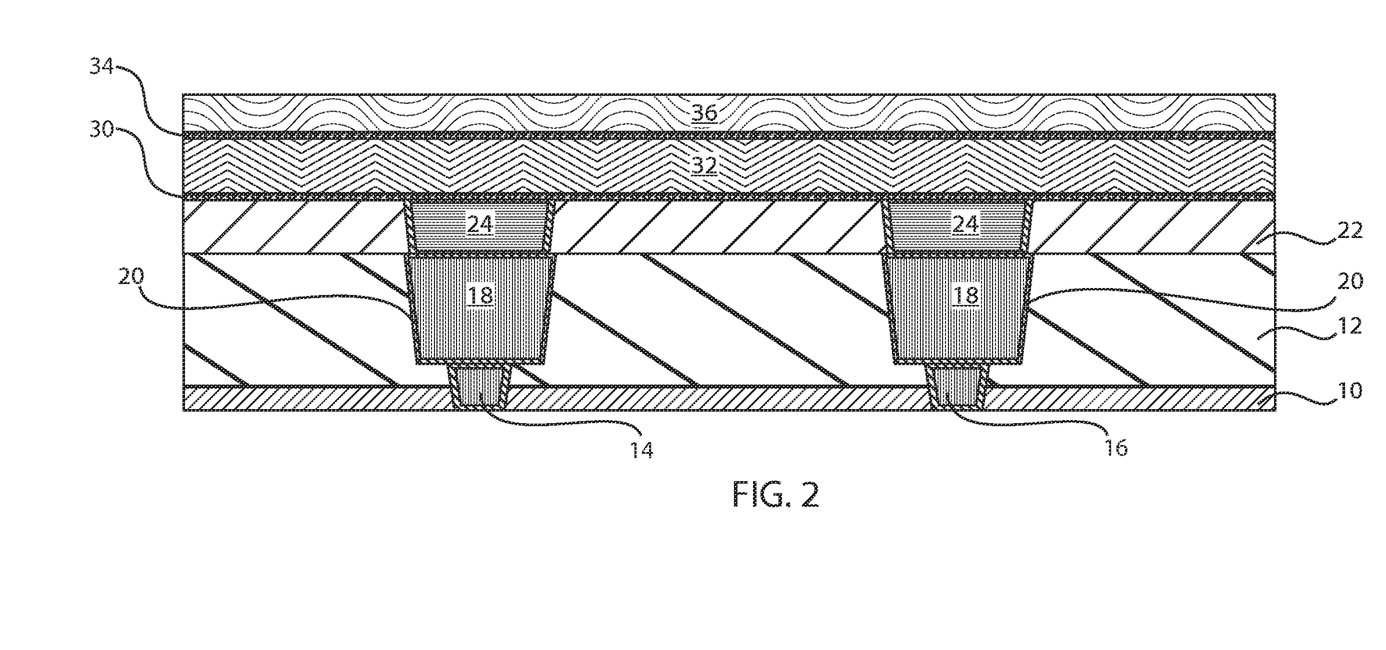
FIG. 2 is a cross-sectional view of the semiconductor structure of FIG. 1 where a GeSbTe (germanium-antimony-tellurium or GST) layer, projection liners, and a hardmask layer are deposited, in accordance with an embodiment of the present invention.

FIG. 2 is a cross-sectional view of the semiconductor structure of FIG. 1 where a GeSbTe (germanium-antimony-tellurium or GST) layer, projection liners, and a hardmask layer are deposited, in accordance with an embodiment of the present invention.

A first projection liner 30, a GST layer 32, a second projection liner 34, and a hardmask layer 36 are deposited over the plurality of metal lines 24 and over the plurality of conductive lines 18. Thus, the GST layer 32 is enclosed within or confined within the first and second projection liners 30, 34. The first projection liner 30 can be referred to as a bottom projection liner and the second projection liner 34 can be referred to as a top projection liner.

The GST layer 32 can have a thickness of between about 20 nm to about 50 nm.

The GST layer 32 can be formed by, e.g., physical vapor deposition (PVD) techniques.

The first and second projection liners 30, 34 can be referred to as phase change material (PCM) liners. The liners 30, 34 can be metal liners. The metal liners 30, 34 can be constructed from metals, such as, for example, tantalum nitride and tantalum (TaN/Ta), titanium, titanium nitride, cobalt, ruthenium, and manganese.

In various example embodiments, the hardmask layer 36 can be a nitride, for example, a silicon nitride (SiN), an oxynitride, for example, silicon oxynitride (SiON), or a combination thereof. In a preferred embodiment, the hardmask layer 36 can be silicon nitride (SiN), for example, $Si_3N_4$.

In one or more embodiments, the hardmask layer 36 can have a thickness in the range of about 20 nm to about 100 nm, or in the range of about 35 nm to about 75 nm, or in the range of about 45 nm to about 55 nm, although other thicknesses are contemplated.

Phase change materials can be changed from one phase state to another by application of electrical pulses. A shorter, higher amplitude pulse tends to change the phase change material to a generally amorphous state, and is referred to as a reset pulse. A longer, lower amplitude pulse tends to change the phase change material to a generally crystalline state, and is referred to as a program pulse. The energy in a shorter, higher amplitude pulse is high enough to melt the material in the active volume, and short enough to allow the material to solidify in the amorphous state.

The phase change materials can include chalcogenide based materials and other materials. Chalcogens include any of the four elements oxygen (O), sulfur (S), selenium (Se), and tellurium (Te), forming part of group VI of the periodic table. Chalcogenides include compounds of a chalcogen with a more electropositive element or radical. Chalcogenide alloys include combinations of chalcogenides with other materials such as transition metals. A chalcogenide alloy usually includes one or more elements from column six of the periodic table of elements, such as germanium (Ge) and tin (Sn). Often, chalcogenide alloys include combinations including one or more of antimony (Sb), gallium (Ga), indium (In), and silver (Ag). Phase change based memory materials can include alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable.

Chalcogenides and other phase change materials are doped with impurities in some embodiments to modify conductivity, transition temperature, melting temperature, and other properties of memory elements using the doped chalcogenides. Representative impurities employed for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide.

In the present example, the phase change material stack preferably includes a Ge—Sb—Te (germanium-antimony-tellurium or "GST") alloy. Alternatively, other suitable materials for the phase change material stack optionally include Si—Sb—Te alloys, Ga—Sb—Te alloys, As—Sb—Te alloys, Ag—In—Sb—Te alloys, Ge—In—Sb—Te alloys, Ge—Sb alloys, Sb—Te alloys, Si—Sb alloys, and combinations thereof.

Figure 3:
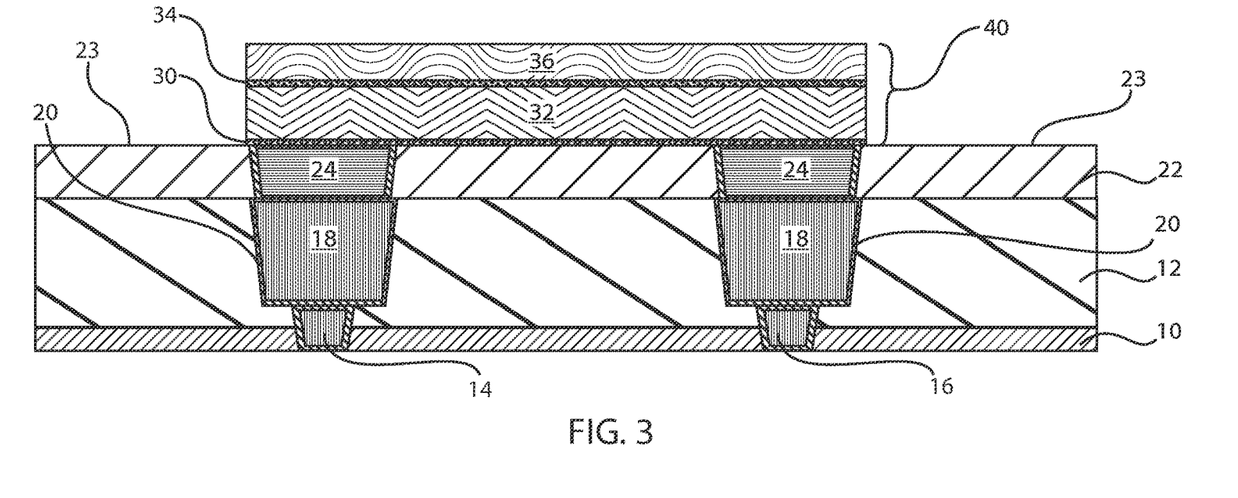
FIG. 3 is a cross-sectional view of the semiconductor structure of FIG. 2 where the GST layer, the projection liners, and the hardmask layer are patterned to form a GST stack, in accordance with an embodiment of the present invention.

FIG. 3 is a cross-sectional view of the semiconductor structure of FIG. 2 where the GST layer, the projection liners, and the hardmask layer are patterned to form a GST stack, in accordance with an embodiment of the present invention.

The GST stack 40 is formed by patterning the first projection liner 30, the GST layer 32, the second projection liner 34, and the hardmask layer 36.

A top surface 23 of the dielectric 22 is thus exposed due to the patterning.

A top view 45 of the structure illustrates the H-shaped configuration of the hardmask layer 36 in relation to the top surface 23 of the dielectric 22. Stated differently, the PCM element defines a fin-type GST cell.

Figure 4:
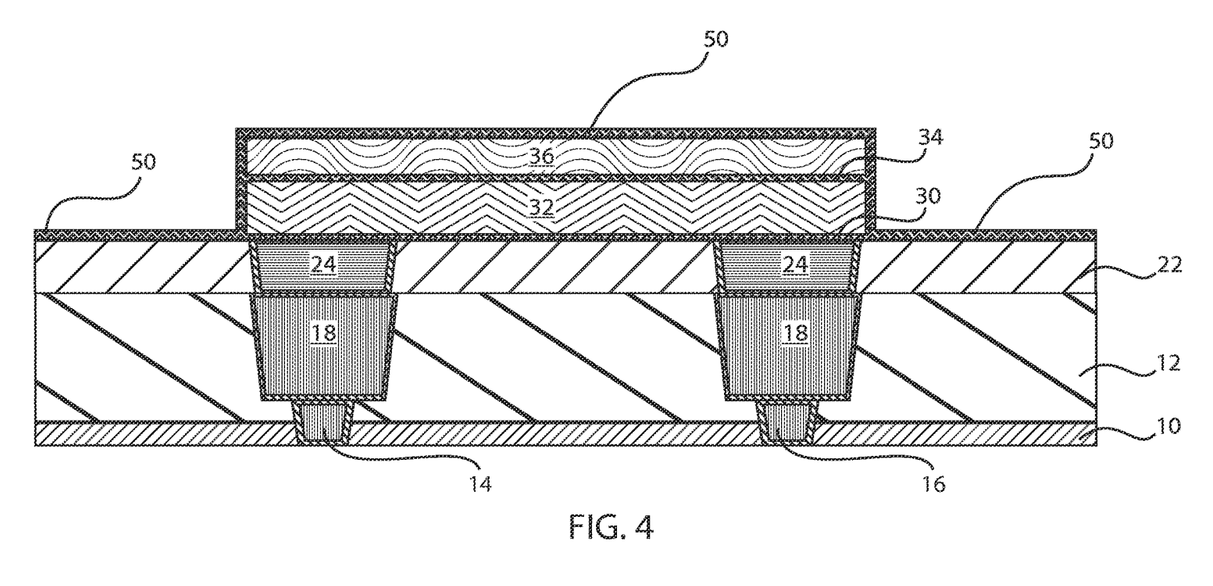
FIG. 4 is a cross-sectional view of the semiconductor structure of FIG. 3 where another projection liner is deposited over the GST stack, in accordance with an embodiment of the present invention.

FIG. 4 is a cross-sectional view of the semiconductor structure of FIG. 3 where another projection liner is deposited over the GST stack, in accordance with an embodiment of the present invention.

A third projection liner 50 is deposited over the GST stack. The third projection liner 50 directly contacts a top surface of the dielectric 22 and directly contacts a top surface of the hardmask layer 36. Additionally, the third projection liner 50 directly contacts sidewalls of the GST layer 32 such that the GST layer 32 is completely encompassed or encapsulated by the first, second, and third projection liners 30, 34, 50.

The third projection liner 50 can be constructed from the same material as the first and second projection liners 30, 34.

The top view 55 illustrates the third projection liner 50 formed over the structure.

Figure 5:
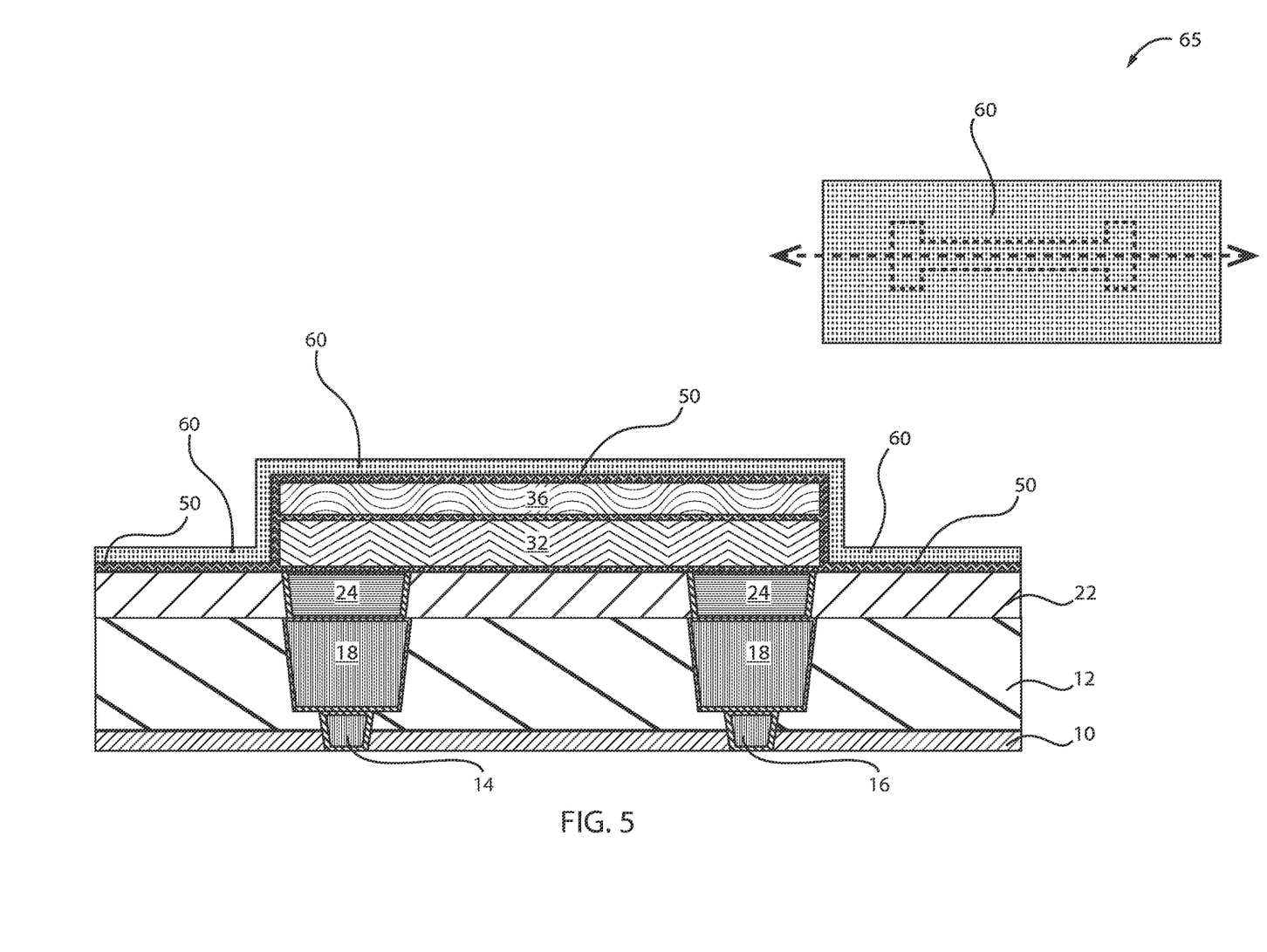
FIG. 5 is a cross-sectional view of the semiconductor structure of FIG. 4 where a spacer layer is deposited, in accordance with an embodiment of the present invention.

FIG. 5 is a cross-sectional view of the semiconductor structure of FIG. 4 where a spacer layer is deposited, in accordance with an embodiment of the present invention.

A spacer layer 60 is deposited over the third projection liner 50.

The top view 65 illustrates the spacer layer 60 over the entire structure.

Figure 6:
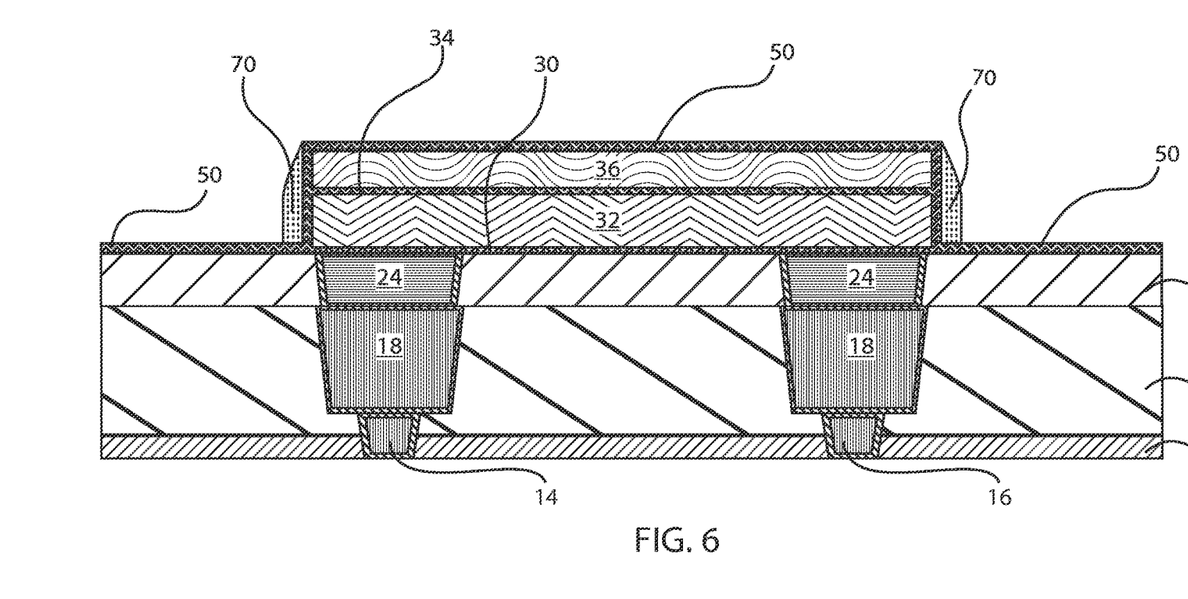
FIG. 6 is a cross-sectional view of the semiconductor structure of FIG. 5 where the spacer layer is etched to form spacers adjacent the projection liner, in accordance with an embodiment of the present invention.

FIG. 6 is a cross-sectional view of the semiconductor structure of FIG. 5 where the spacer layer is etched to form spacers adjacent the projection liner, in accordance with an embodiment of the present invention.

The spacer layer 60 is etched to form spacers 70 adjacent the GST stack 40. The formation of the spacers 70 results in the exposure of surfaces of the third projection liner 50. The GST layer 32 is encapsulated or encompassed by the first, second, and third projection liners 30, 34, 50. Stated differently, the GST layer 32 is surrounded or confined by the projection liners 30, 34, 50. In particular, the bottom section of the GST layer 32 directly contacts the first projection liner 30, the top section of the GST layer 32 directly contacts the second projection liner 34, and the sidewalls of the GST layer 32 directly contacts the third projection liner 50. As a result, the first, second, and third projection liners 30, 34, 50 collectively define a projection liner that fully encapsulates or encloses or surrounds the GST layer 32.

The PCM structure can be referred to as a horizontally confined PCM cell. The PCM structure thus includes a GST layer 32 with an all-around or wrap-around projection liner that completely and fully wraps around the GST layer 32.

The top view 75 illustrates the relationship between the spacers 70 and the third projection liner 50, as well as their relation to the hardmask layer 36.

Spacers 70 can include any one or more of SiN, SiBN, SiCN and/or SiBCN films.

Figure 7:
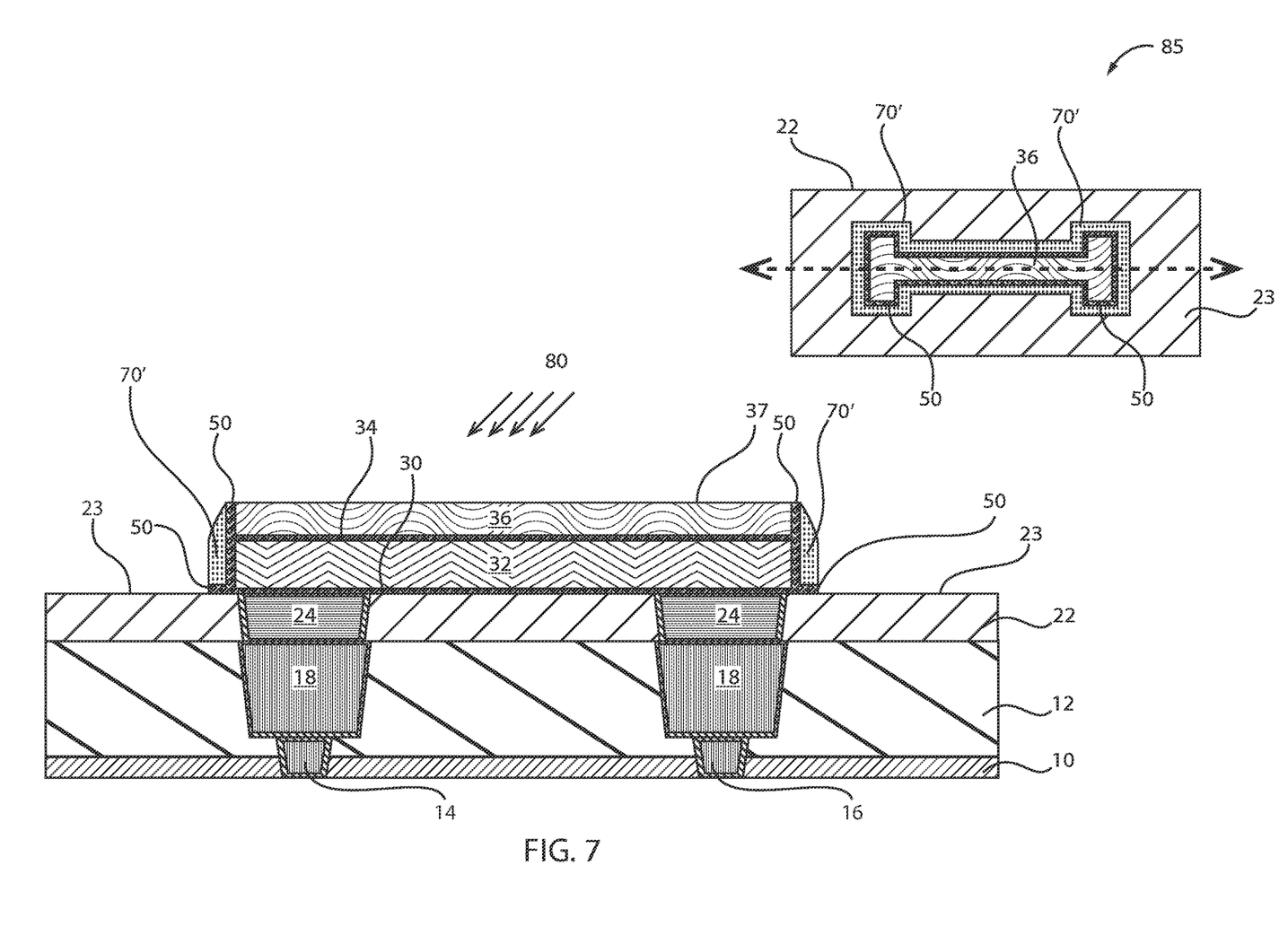
FIG. 7 is a cross-sectional view of the semiconductor structure of FIG. 6 where the projection liner is etched, in accordance with an embodiment of the present invention.

FIG. 7 is a cross-sectional view of the semiconductor structure of FIG. 6 where the projection liner is etched, in accordance with an embodiment of the present invention.

The exposed surfaces of the third projection liner 50 are etched by, e.g., a reactive ion etch (RIE) process 80. This results in the exposure of the top surface 23 of the dielectric 22, as well as the exposure of the top surface 37 of the hardmask layer 36. This further results in the recess of spacers 70 to form spacers 70'. The GST layer 32 remains encapsulated by the collective first, second, and third projection liners 30, 34, 50. The third projection liner 50 extends vertically above the GST layer 32 such that the sidewalls of the hardmask layer 36 directly contact the third projection liner 50. Thus, the edges of the third projection liner 50 define an L-shaped and an inverted L-shaped configuration. The L-shaped and inverted L-shaped configurations accommodate the spacers 70'.

The top view 85 illustrates the relationship between the spacers 70', the hardmask layer 36, and the dielectric 22. Additionally, the fin-type GST cell highlights the fin-type configuration of the third projection liner 50.

Consequently, the first projection liner 30, the second projection liner 34, and the third projection liner 50 collectively define a single projection liner with segments 30, 34, 50 that cooperate to fully encapsulate the GST layer 32 therein.

Figure 8:
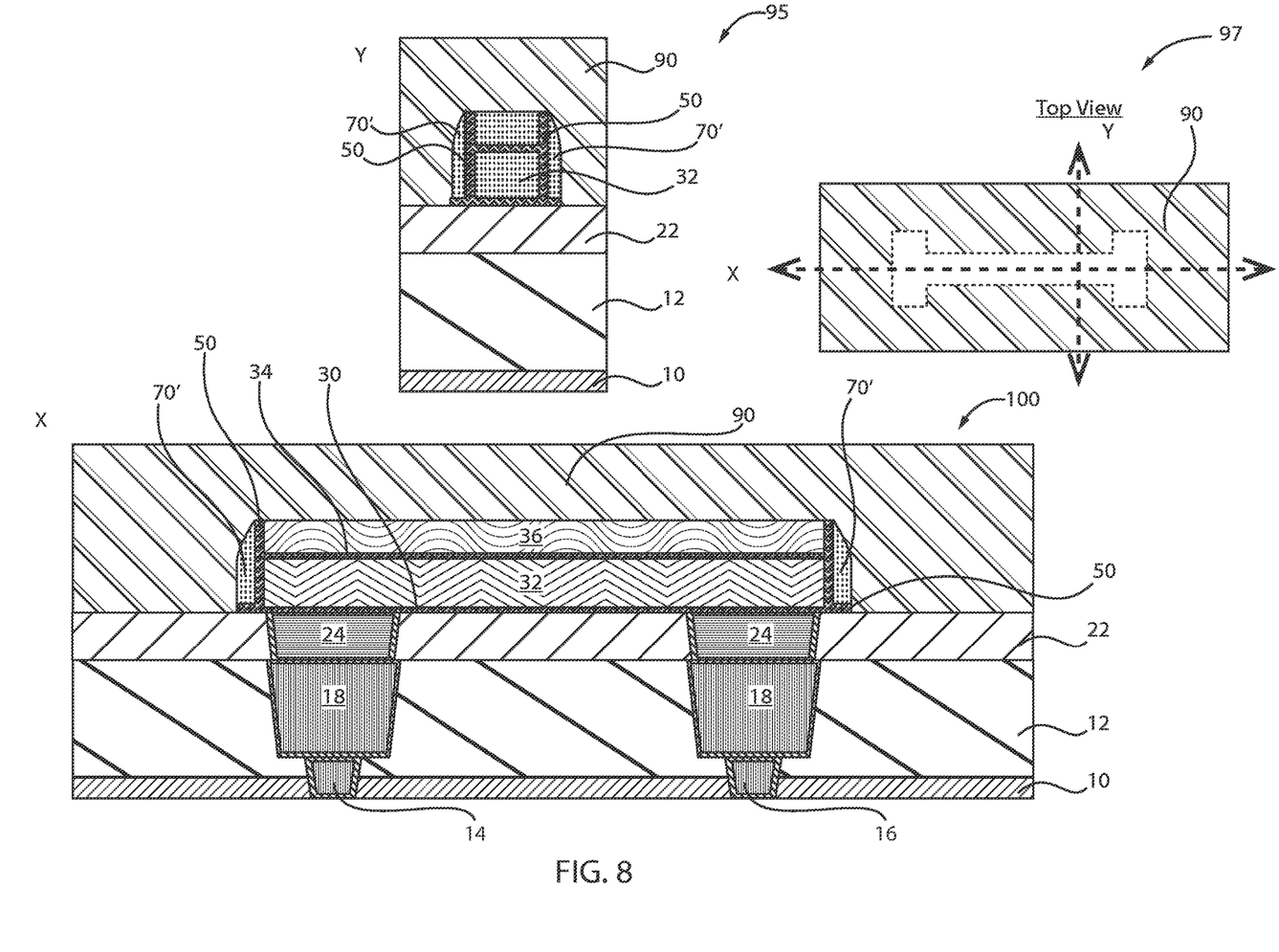
FIG. 8 is a cross-sectional view of the semiconductor structure of FIG. 7 where top layer formation takes place, in accordance with an embodiment of the present invention.

FIG. 8 is a cross-sectional view of the semiconductor structure of FIG. 7 where top layer formation takes place, in accordance with an embodiment of the present invention.

An ILD 90 can be deposited over the GST stack to form structure 100. The ILD 90 directly contacts the top surface of the dielectric 22, the spacers 70', and the top surface of the hardmask layer 36.

The top view 97 illustrates the deposition of the ILD 90 and defines the fin-type GST cell. An X-axis extends horizontally though the-type GST cell and a Y-axis extends vertically though the-type GST cell.

The Y view 95 illustrates the single liner collectively formed from first, second, and third liners 30, 34, 50 defining a substantially H-shaped configuration. The GST layer 32 is confined within the single liner 30, 34, 50.

The X view 100 illustrates the contacts 14, 16 horizontally and electrically communicating with the PCM element having the GST layer 32.

In conclusion, the exemplary embodiments of the present invention form a wrap-around or all-around projection liner that minimizes reactive ion etch (RIE) damage during PCM formation. The exemplary embodiments employ a horizontal confined cell structure of GST with the projection liner. The exemplary embodiments introduce a self-aligned bridge cell contact. Stated differently, a structure of a horizontal mushroom cell structure is introduced to improve endurance and resistance drift and programing current. As a result, the exemplary methods minimize WET damage of GST cells.

In conclusion, a semiconductor structure is formed including a horizontally confined PCM cell, where the PCM structure includes a GST layer enclosed or encompassed or surrounded by a projection liner (all-around or wrap-around projection liner). The confined cell PCM can be formed by physical vapor deposition (PVD). The method of forming the semiconductor structure minimizes reactive ion etch (RIE) damage to the GST layer, thus forming a CMP, WET or RIE damage-free GST cell. The method of forming the semiconductor structure further includes constructing a wrap-around projection liner encapsulating the GST layer.

As a result, the exemplary embodiments introduce a horizontal confined cell structure of GST with a projection liner which suggests a self-aligned bridge cell contact with a GST all-around projection liner.

Regarding FIGS. 1-8, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method and structure for forming a projection liner for an artificial intelligence (AI) device (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor structure comprising:
a phase change memory (PCM) element horizontally and electrically connecting a first contact and a second contact; and
a projection liner encapsulating the PCM element including a backside surface of the PCM element to position a portion of the projection liner directly between the PCM element and the second contact.

2. The semiconductor structure of claim 1, wherein spacers are formed adjacent the projection liner.

3. The semiconductor structure of claim 1, wherein spacers directly contact sidewalls of the projection liner.

4. The semiconductor structure of claim 1, wherein the PCM element includes a GeSbTe (germanium-antimony-tellurium or GST) layer.

5. The semiconductor structure of claim 4, wherein a hardmask layer is formed over the GST layer.

6. The semiconductor structure of claim 5, wherein sidewalls of the hardmask layer directly contact portions of the projection liner.

7. The semiconductor structure of claim 1, wherein conductive lines are formed between the PCM element and the first and second contacts.

8. A semiconductor structure comprising:
a plurality of conductive lines formed within a dielectric, wherein each of the plurality of conductive lines electrically communicates with a respective contact;
a metal layer disposed over each of the plurality of conductive lines;
a phase change memory (PCM) element disposed over the metal layer of each of the plurality of conductive lines; and a projection liner encapsulating the PCM element including both an upper surface and a backside surface of the PCM element, wherein a portion of the projection liner is directly between the PCM element and the metal layer.

9. The semiconductor structure of claim 8, wherein spacers are formed adjacent the projection liner.

10. The semiconductor structure of claim 8, wherein spacers directly contact sidewalls of the projection liner.

11. The semiconductor structure of claim 8, wherein the PCM element includes a GeSbTe (germanium-antimony-tellurium or GST) layer.

12. The semiconductor structure of claim 11, wherein a hardmask layer is formed over the GST layer.

13. The semiconductor structure of claim 12, wherein sidewalls of the hardmask layer directly contact portions of the projection liner.

14. A method comprising:
forming a phase change memory (PCM) element;
horizontally and electrically connecting the PCM element to a first contact and a second contact; and
encapsulating the PCM element with a projection liner including a backside surface of the PCM element to position a portion of the projection liner directly between the PCM element and the second contact.

15. The method of claim 14, further comprising forming spacers adjacent the projection liner.

16. The method of claim 14, wherein the PCM element includes a GeSbTe (germanium-antimony-tellurium or GST) layer.

17. The method of claim 16, further comprising forming a hardmask layer over the GST layer.

18. The method of claim 17, wherein sidewalls of the hardmask layer directly contact portions of the projection liner.

19. The method of claim 14, wherein the PCM element defines a fin-type GST cell.

20. The method of claim 14, wherein the PCM element is formed by physical vapor deposition (PVD).

* * * * *